US010825980B2

(12) United States Patent
Kijima et al.

(10) Patent No.: US 10,825,980 B2
(45) Date of Patent: Nov. 3, 2020

(54) VIBRATING DEVICE

(71) Applicant: TDK CORPORATION, Tokyo (JP)

(72) Inventors: Kaoru Kijima, Tokyo (JP); Tatsuya Taki, Tokyo (JP); Kazushi Tachimoto, Tokyo (JP); Toshiki Maruyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 435 days.

(21) Appl. No.: 15/894,315

(22) Filed: Feb. 12, 2018

(65) Prior Publication Data

US 2018/0233653 A1    Aug. 16, 2018

(30) Foreign Application Priority Data

Feb. 13, 2017  (JP) ................................. 2017-024314
Mar. 10, 2017 (JP) ................................. 2017-046267
Aug. 24, 2017 (JP) ................................. 2017-161352
Aug. 24, 2017 (JP) ................................. 2017-161354

(51) Int. Cl.
*H01L 41/047*       (2006.01)
*H01L 41/053*       (2006.01)
(Continued)

(52) U.S. Cl.
CPC ...... *H01L 41/0475* (2013.01); *H01L 41/0471* (2013.01); *H01L 41/0472* (2013.01);
(Continued)

(58) Field of Classification Search
CPC ............. H01L 41/0471; H01L 41/0474; H01L 41/0477; H01L 41/083; H01L 41/09; H01L 41/0973; H01L 41/0475; H01L 41/187
(Continued)

(56) References Cited

U.S. PATENT DOCUMENTS 4,725,994 A *  2/1988  Kaneko ................. B06B 1/0692
                                                     310/334
7,347,826 B1 * 3/2008  Karicherla ........... A61B 5/0215
                                                     600/549
(Continued)

FOREIGN PATENT DOCUMENTS

JP    H04-070100 A    3/1992
JP    H10-315485 A    12/1998
(Continued)

*Primary Examiner* — Thomas M Dougherty
(74) *Attorney, Agent, or Firm* — Oliff PLC

(57) ABSTRACT

A vibrating device includes a diaphragm, a piezoelectric element, and a wiring board. The piezoelectric element and the wiring board are bonded to a first principal plane of the diaphragm. The wiring board is electrically connected with the piezoelectric element. The piezoelectric element includes a piezoelectric element body, a plurality of internal electrodes, and a plurality of external electrodes. The piezoelectric element body has a second principal plane, a third principal plane, and a side surface. The third principal plane and the side surface are bonded to the first principal plane. The wiring board has a resin film, a plurality of conductors, and a coating film. The coating film is disposed on the plurality of conductors in such a way as to cover the plurality of conductors. One end portions of the plurality of conductors are exposed from the coating film and electrically connected with corresponding external electrodes.

13 Claims, 11 Drawing Sheets

(51) Int. Cl.
*H01L 41/083* (2006.01)
*H01L 41/09* (2006.01)

(52) U.S. Cl.
CPC ...... *H01L 41/0474* (2013.01); *H01L 41/0533* (2013.01); *H01L 41/083* (2013.01); *H01L 41/09* (2013.01); *H01L 41/0973* (2013.01)

(58) Field of Classification Search
USPC .......................................... 310/311–371, 800
See application file for complete search history.

(56) References Cited

U.S. PATENT DOCUMENTS

| | | | | |
|---|---|---|---|---|
| 2008/0100674 | A1* | 5/2008 | Azumi | B41J 2/14274 347/68 |
| 2012/0223986 | A1* | 9/2012 | Yamada | B41J 11/06 347/10 |
| 2012/0274688 | A1* | 11/2012 | Okada | B41J 29/38 347/10 |
| 2015/0163598 | A1* | 6/2015 | Abe | H01L 41/053 381/114 |
| 2018/0233653 | A1* | 8/2018 | Kijima | H01L 41/0471 |
| 2020/0101735 | A1* | 4/2020 | Okazawa | B41J 2/1433 |

FOREIGN PATENT DOCUMENTS

| | | |
|---|---|---|
| JP | 2006-150808 A | 6/2006 |
| JP | 2016-051895 A | 4/2016 |

\* cited by examiner

VIBRATING DEVICE

TECHNICAL FIELD

One aspect of the present invention relates to a vibrating device including a piezoelectric element.

BACKGROUND

A vibrating device including a piezoelectric element, a wiring board electrically connected with the piezoelectric element, and a diaphragm bonded to the piezoelectric element is known (for example, Japanese Unexamined Patent Publication No. H4-070100).

SUMMARY

In the vibrating device described above, the following problems may occur.

A wiring board has one end portion connected to a diaphragm, and the other end portion connected to a component on an electronic device side on which the vibrating device is mounted. The one end portion of the wiring board is physically connected to the diaphragm and is electrically connected to a piezoelectric element, for example. The other end portion of the wiring board is electrically and physically connected to a connector, for example.

The one end portion of the wiring board is physically connected to the diaphragm. Therefore, vibration is transmitted from the diaphragm to the wiring board. The other end portion of the wiring board is physically connected to the component on the electronic device side, and thus vibration less easily occurs. Therefore, when the diaphragm vibrates, a mechanical load acts on a connection portion between the one end portion of the wiring board and the diaphragm. When the mechanical load acts on the connection portion, physical connection between the wiring board and the diaphragm and electrical connection between the wiring board and the piezoelectric element are deteriorated, and the reliability of the vibrating device may be decreased. For example, the wiring board arid the diaphragm may be separated from each other. The wiring board and the piezoelectric element may be disconnected to each other.

One aspect of the present invention is to provide a vibrating device in which a decrease in reliability is suppressed.

A vibrating device according to one aspect of the present invention includes a diaphragm, a piezoelectric element, and a wiring board. The diaphragm has a first principal plane. The piezoelectric element is bonded to the first principal plane. The wiring board is bonded to the first principal plane. The wiring board is electrically connected with the piezoelectric element. The piezoelectric element includes a piezoelectric element body, a plurality of internal electrodes, and a plurality of external electrodes. The piezoelectric element body contains a piezoelectric material. The piezoelectric element body has a second principal plane, a third principal plane, and a side surface. The second principal plane and the third principal plane are opposed to each other. The side surface is adjacent to the second principal plane and the third principal plane. The plurality of internal electrodes is disposed in the piezoelectric element body. The plurality of internal electrodes opposed to one another in an opposing direction of the second principal plane and the third principal plane. The plurality of external electrodes is disposed on the second principal plane. The plurality of external electrodes is electrically connected with corresponding internal electrodes, of the plurality of internal electrodes. The third principal plane and the side surface are bonded to the first principal plane. The wiring board has a resin film, a plurality of conductors, and a coating film. The plurality of conductors is disposed to extend over the resin film. The coating film is disposed on the plurality of conductors in such a way as to cover the plurality of conductors. One end portions of the plurality of conductors are exposed from the coating film and electrically connected with corresponding external electrodes, of the plurality of external electrodes.

In the vibrating device according to the above aspect, the third principal plane and the side surface of the piezoelectric element are bonded to the first principal plane of the diaphragm. Therefore, physical bonding strength between the piezoelectric element and the diaphragm is high. Therefore, in the vibrating device of the present aspect, displacement of the piezoelectric element is efficiently transmitted to the diaphragm. The wiring board is electrically connected with the piezoelectric element in a state of being bonded to the first principal plane of the diaphragm together with the piezoelectric element. In the wiring board, the conductors are covered with the resin film and the coating film, except for the one end portions electrically connected with the external electrodes. Therefore, the wiring board can be bonded to the first principal plane in a state where the conductors and the diaphragm are insulated. Since the wiring board is bonded to the first principal plane, when vibration is transmitted from the piezoelectric element to the diaphragm and the diaphragm vibrates, the wiring hoard is displaced in synchronization with the piezoelectric element. Therefore, the mechanical load is less easily applied to the connection portion between the wiring board and the piezoelectric element than a case where the wiring board is not bonded to the first principal plane of the diaphragm and the wiring board is not displaced in synchronization with the piezoelectric element. Therefore, in the vibrating device of the present aspect, a decrease in reliability is suppressed.

The wiring board may be disposed in such a way that the coating film is opposed to the first principal plane. The coating film may be bonded to the first principal plane. The one end portions may be disposed on the corresponding external electrodes. In this case, the one end portions are disposed on the corresponding external electrodes, and thus the mechanical load due to the displacement of the piezoelectric element less easily acts on the connection portion between the one end portions and the external electrodes than a case where the one end portions and the external electrodes are disposed and connected in a direction into which the piezoelectric element is displaced. Therefore, the decrease in reliability is further suppressed.

The coating film may have an overlapping region overlapping with the piezoelectric element as viewed from the opposing direction. In this case, an exposed portion of the diaphragm and the one end portions of the conductors are separated from each other by at least the length of the overlapping region. Therefore, contact between the diaphragm and the conductors is suppressed. With the configuration, occurrence of short circuit between the electrodes can be suppressed.

The overlapping region may be separated from the piezoelectric element in the opposing direction. Therefore, damage to the piezoelectric element 10 due to contact of the overlapping region with the piezoelectric element can be suppressed.

The overlapping region may be separated from the internal electrodes as viewed from the opposing direction. In this case, contact of the overlapping region with a region of the piezoelectric element, the region generating displacement of the piezoelectric element, and in which the internal electrodes are disposed. Therefore, impediment of the displacement of the piezoelectric element can be suppressed.

The third principal plane and the side surface may be bonded to the first principal plane by a first bonding member. The coating film may be bonded to the first principal plane by a second bonding member. The first bonding member and the second bonding member may be separated from each other. In this case, even if the second bonding member is, for example, a resin having fluidity, infiltration of the second bonding member between the piezoelectric element and the wiring board via the first bonding member can be suppressed. Therefore, a decrease in flatness of the wiring board due to the infiltration of the second bonding member between the piezoelectric element and the wiring board is suppressed. As a result, a local load is less easily act on the conductors. With the configuration, the decrease in reliability can be further suppressed.

A vibrating device according to another aspect of the present invention includes a piezoelectric element, a wiring board electrically connected with the piezoelectric element, and a diaphragm to which the piezoelectric element and the wiring board are bonded. The piezoelectric element includes a piezoelectric element body, a plurality of internal electrodes, and a plurality of external electrodes. The piezoelectric element body contains a piezoelectric material, and has a first principal plane and a second principal plane opposed to each other, and a side surface adjacent to the first principal plane and the second principal plane. A plurality of internal electrodes is disposed in the piezoelectric element body and the internal electrodes are opposed to one another in a direction in which the first principal plane and the second principal plane are opposed. A plurality of external electrodes is disposed on the first principal plane, and is electrically connected with corresponding internal electrodes, of the plurality of internal electrodes. The wiring board includes a resin film and a plurality of conductors. The resin film has a third principal plane and a fourth principal plane opposed to each other. The plurality of conductors is disposed on the third principal plane, and is electrically connected with corresponding external electrodes, of the plurality of external electrodes. The second principal plane, the side surface and the fourth principal plane are bonded to the diaphragm. A first distance between the fourth principal plane and the diaphragm is larger than a second distance between the second principal plane and the diaphragm.

In the vibrating device according to the another aspect of the present invention, the second principal plane and the side surface of the piezoelectric element are bonded to the diaphragm. Therefore, physical bonding strength between the piezoelectric element and the diaphragm is high. In the case where the second distance is smaller than the first distance, the distance between the piezoelectric element and the diaphragm is smaller than a case where the second distance is equal to or larger than the first distance. Therefore, the displacement transmitted from the piezoelectric element to the diaphragm less easily attenuates between the piezoelectric element and the diaphragm. Therefore, in the vibrating device of the present aspect, displacement of the piezoelectric element is efficiently transmitted to the diaphragm.

Since the fourth principal plane of the wiring board is bonded to the diaphragm, the physical connection strength between the wiring board and the diaphragm is lower than the physical connection strength between the piezoelectric element and the diaphragm. In the case where the first distance is larger than the second distance, the distance between the wiring board and the diaphragm is larger than the case where the first distance is equal to or smaller than the second distance. Therefore, the vibrations transmitted from the diaphragm to the wiring board is easily attenuated between the diaphragm and the wiring board. Therefore, in the vibrating device of the present aspect, vibration of the diaphragm is less easily transmitted to the wiring board.

In the vibrating device of the present aspect, as described above, the displacement of the piezoelectric element is efficiently transmitted to the diaphragm, and thus the displacement amount of the vibrating device is improved. In the vibrating device of the present aspect, the vibration of the diaphragm is less easily transmitted to the wiring board despite of the improvement of the displacement amount of the vibrating device. Therefore, a mechanical load less easily acts on the bonding portion between the wiring board and the diaphragm. Therefore, in the vibrating device of the present aspect, the decrease in reliability is suppressed.

The external electrodes and the corresponding conductors may be connected to each other with a conductive resin. Each of the conductors may have a fifth principal plane in contact with the third principal plane and a sixth principal plane opposed to the fifth principal plane and in contact with the conductive resin. The height position of the sixth principal plane from the diaphragm and the height position of the external electrode from the diaphragm may be different from each other. In the present aspect, the height position of the sixth principal plane from the diaphragm and the height position of the external electrode from the diaphragm are different from each other. Therefore, a level difference is formed between the sixth principal plane of the conductor and the external electrode.

The conductive resin is typically formed by applying a conductive paste containing a resin and a conductive material and curing the resin contained in the conductive paste. When the conductive paste is applied to a portion at a high position from the diaphragm, the applied conductive paste is transmitted on the level difference and easily reaches a portion at a low position from the diaphragm. As a result, according to the present aspect, the external electrode and the conductor are reliably electrically and physically connected with the conductive resin. Therefore, the decrease in reliability of the vibrating device is further suppressed.

The height position of the sixth principal plane from the diaphragm may be lower than the height position of the external electrode from the diaphragm. The resin film may further have a first end surface opposed to the side surface of the piezoelectric element body and each of the conductors may have a second end surface opposed to the side surface of the piezoelectric element body. The whole of the first end surface and the second end surface may be bonded to the diaphragm.

For example, in a case where the height position of the sixth principal plane from the diaphragm is higher than the height position of the external electrode from the diaphragm, and only a part of the first end surface is bonded to the diaphragm, displacement of the piezoelectric element is transmitted only to the part of the first end surface. In this case, stress is unevenly distributed in the wiring board, and the reliability of the wiring board may be decreased. In contrast, in the present aspect, the height position of the sixth principal plane from the diaphragm is lower than the height position of the external electrode from the diaphragm, and whole of the first end surface and the second end surface is bonded to the diaphragm. Therefore, the displacement of the piezoelectric element is transmitted to the whole of the first end surface and the second end surface. Therefore, the stress is less unevenly distributed in the wiring board, and the decrease in the reliability of the wiring board is suppressed. In addition, the applied conductive paste easily reaches the conductors from the external electrodes. As a result, in the present aspect, the decrease in reliability of the vibrating device is further suppressed.

The second principal plane and the side surface may be bonded to the diaphragm by a first bonding member. The fourth principal plane may be bonded to the diaphragm by a second bonding member. In this case, the vibrating device having the first distance larger than the second distance can be easily and reliably configured.

Conductors electrically connected with the internal electrodes may not be disposed on the second principal plane. In this case, even when the diaphragm contains a metal, the piezoelectric element (internal electrodes) and the diaphragm are electrically insulated. Therefore, a short circuit between the piezoelectric element and the diaphragm less easily occur, and the reliability of the vibrating device is improved.

The plurality of internal electrodes may not be exposed to the side surface. In this case, the piezoelectric element and the diaphragm are more reliably electrically insulated.

The plurality of external electrodes may be separated from all of edges of the plurality of internal electrodes as viewed from the direction in which the first principal plane and the second principal plane are opposed. In this case, the plurality of external electrodes is separated from the edges of the first principal plane as viewed from the direction in which the first principal plane and the second principal plane are opposed. Therefore, even when the diaphragm contains a metal, the piezoelectric element (external electrodes) and the diaphragm are electrically insulated.

DETAILED DESCRIPTION

Hereinafter, embodiments will be described in detail with reference to the accompanying drawings. Note that, in the description, the same reference sign is used for the same elements or elements having the same function, and redundant description is omitted.

Figure 1:
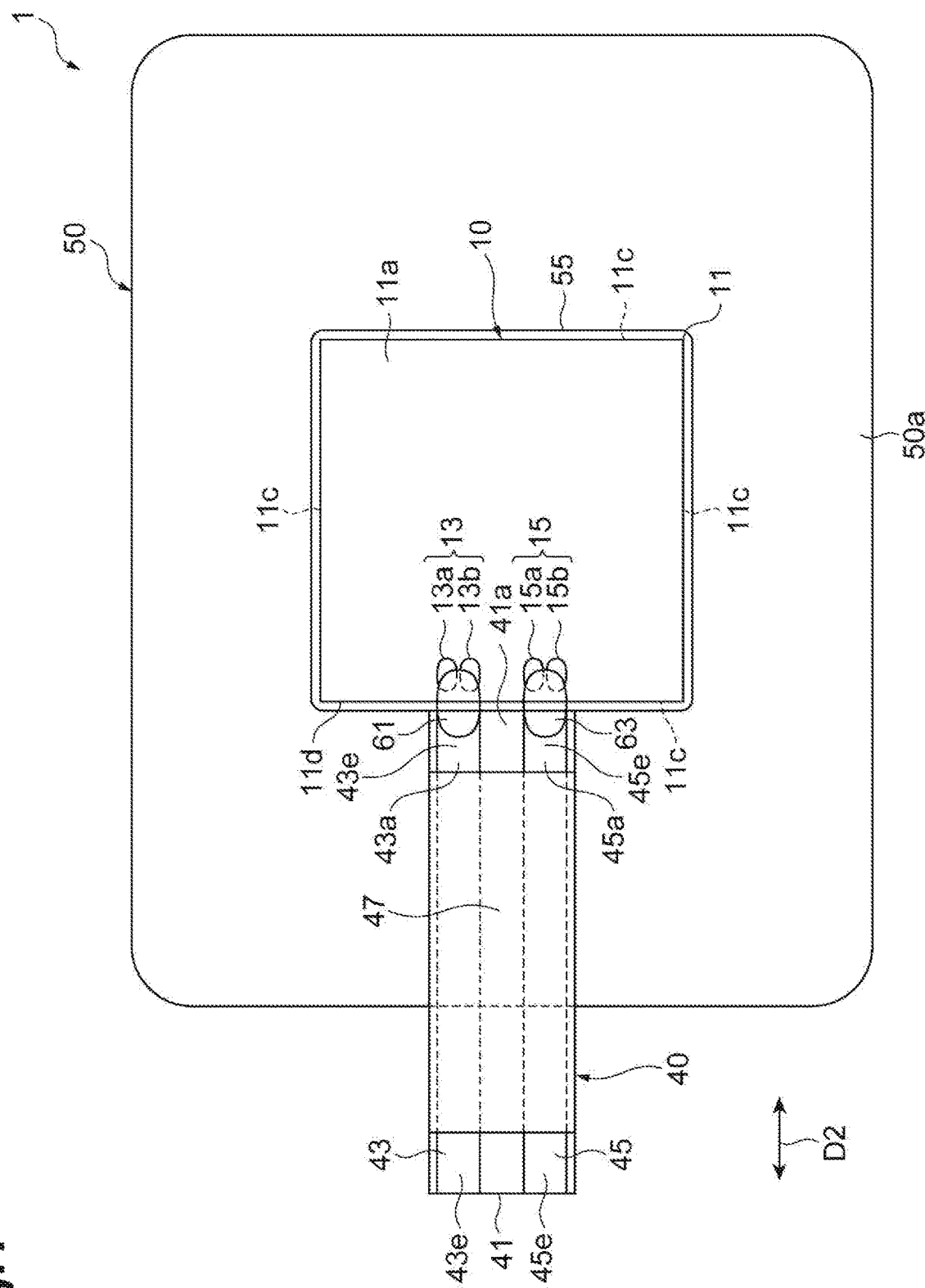
FIG. 1 is a plan view of a vibrating device according to an embodiment.
Figure 4:
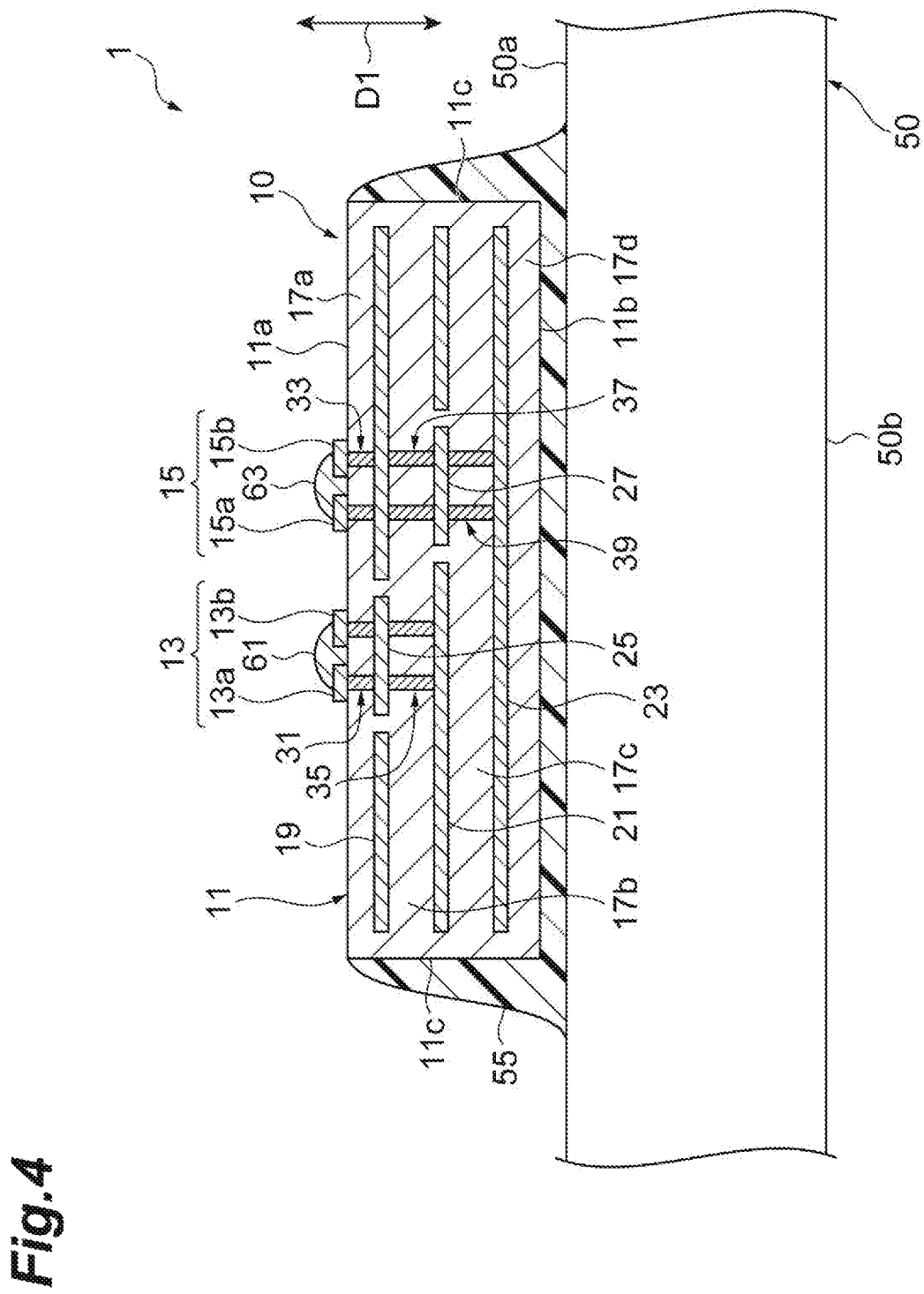
FIG. 4 is a view illustrating a sectional configuration of the vibrating device according to the present embodiment.
Figure 5:
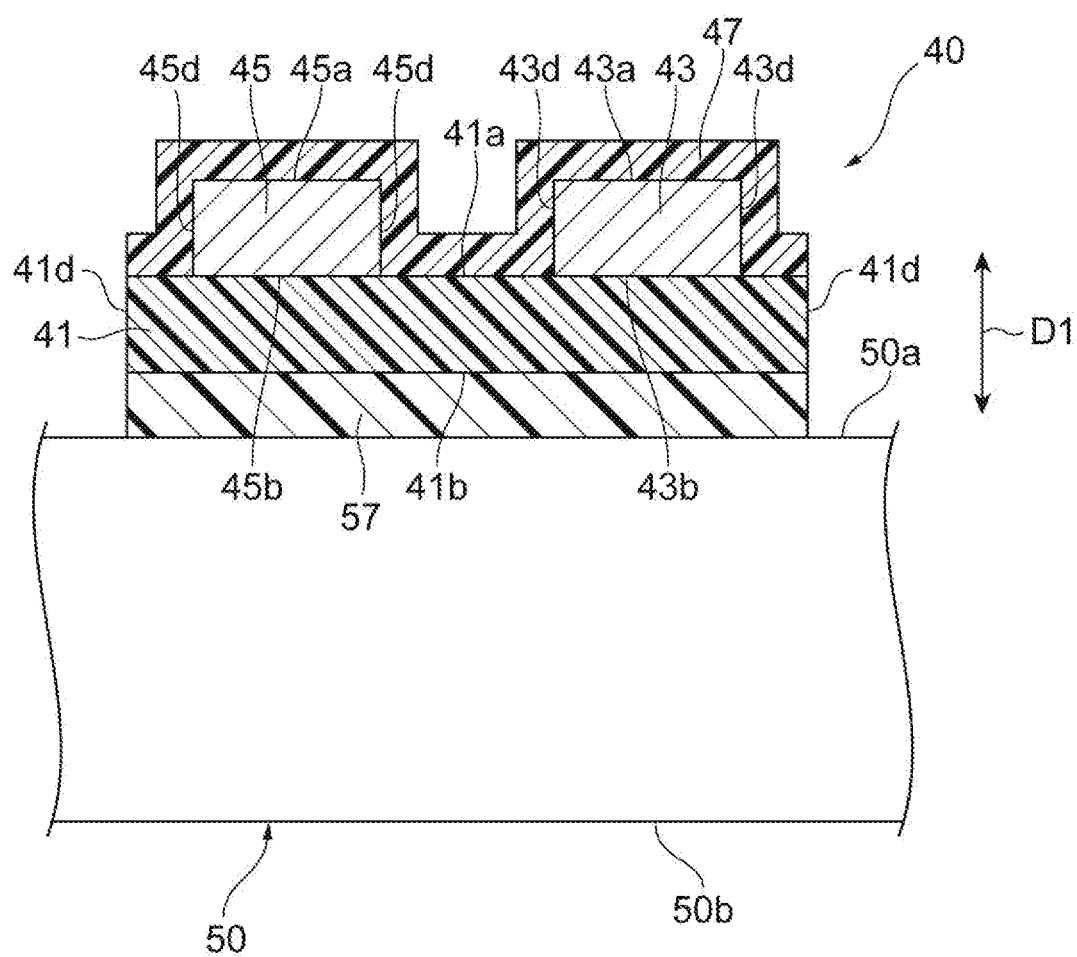
FIG. 5 is a view illustrating a sectional configuration of the vibrating device according to the present embodiment.
Figure 6:
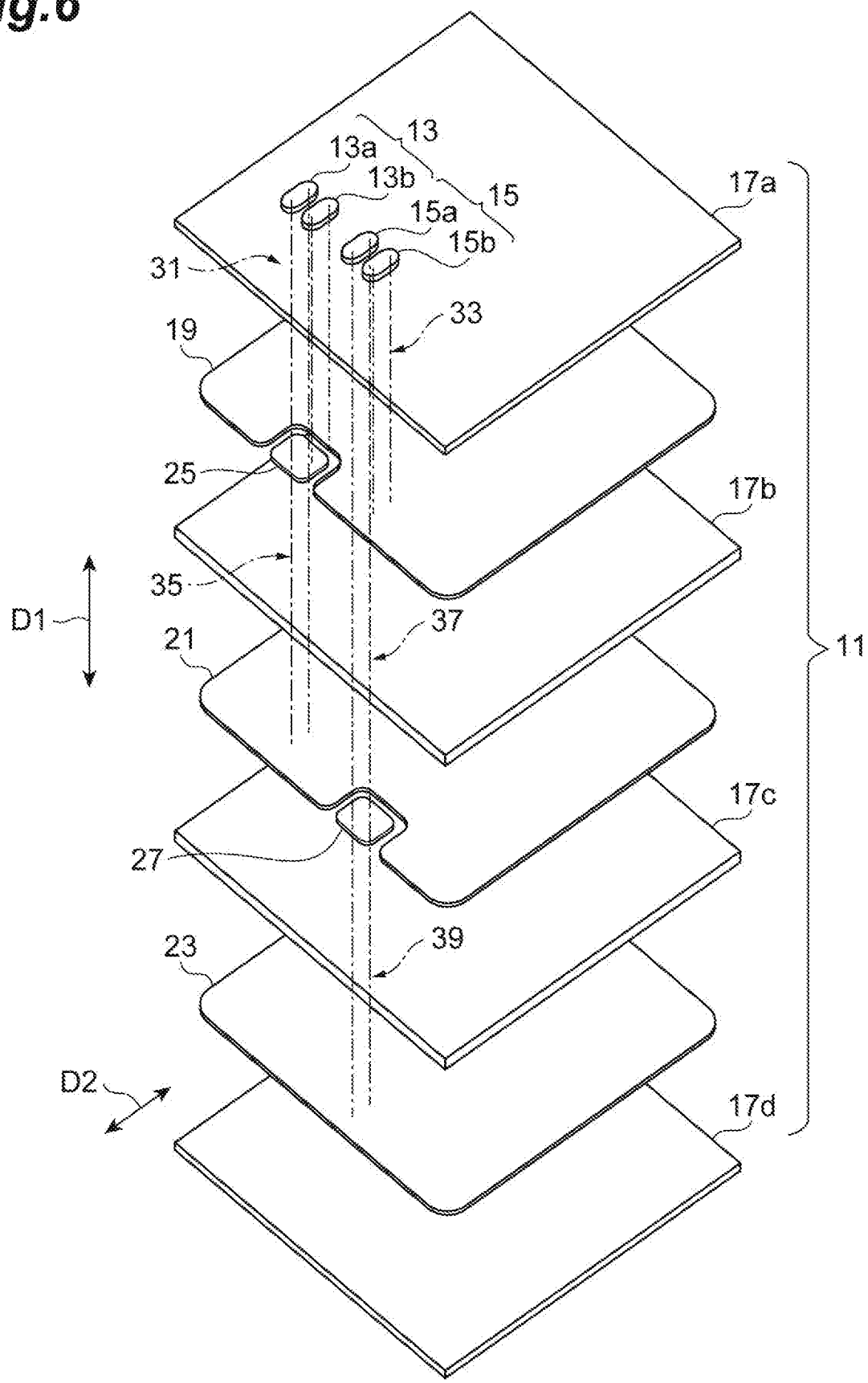
FIG. 6 is an exploded perspective view illustrating a configuration of a piezoelectric element.
Figure 7:
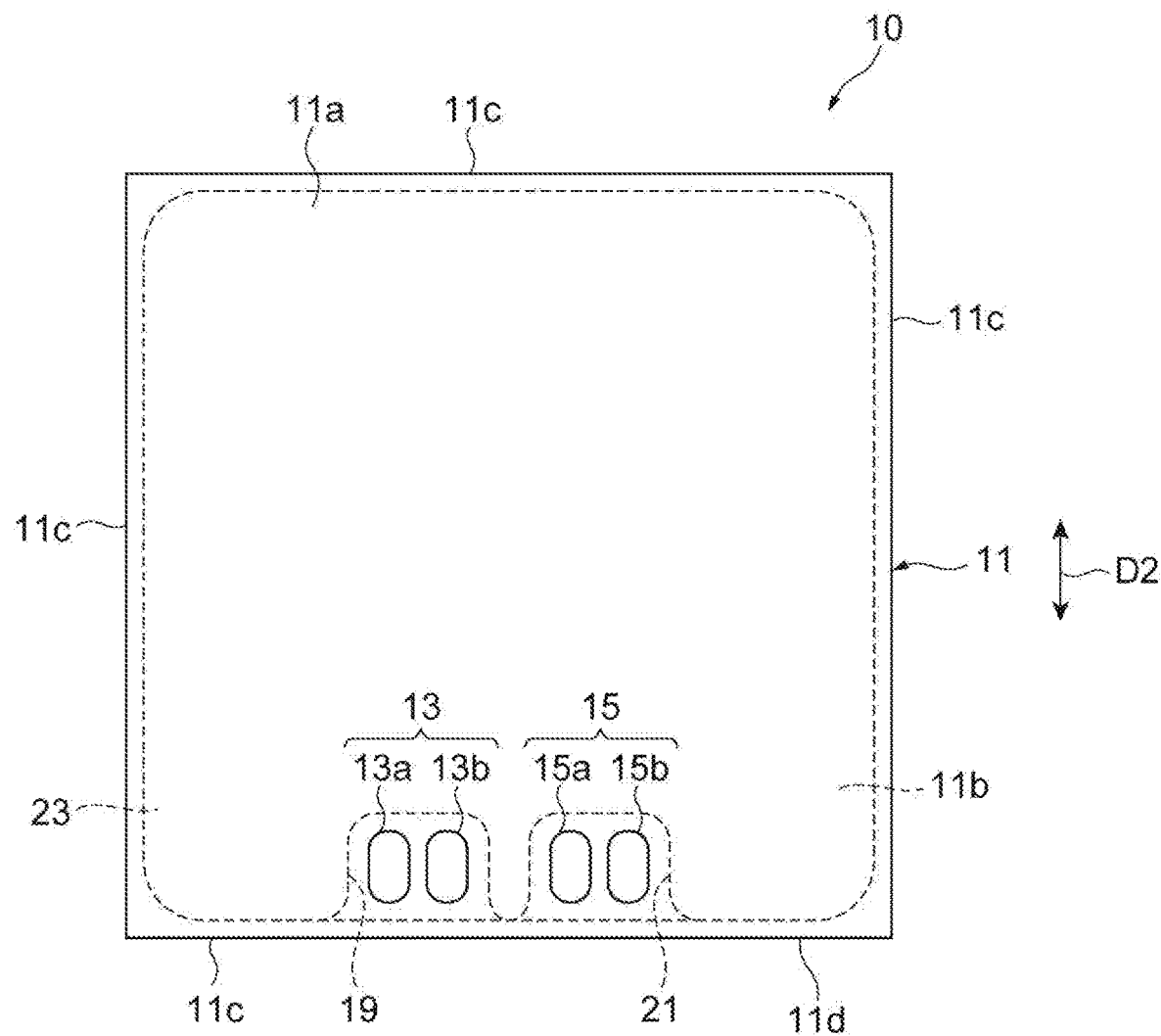
FIG. 7 is a plan view of the piezoelectric element.

A configuration of a vibrating device 1 according to the present embodiment will be described with reference to FIGS. 1 to 7. FIG. 1 is a plan view of a vibrating device according to an embodiment. FIGS. 3, 4, and 5 are views illustrating a sectional configuration of the vibrating device according to the present embodiment. FIG. 6 is an exploded perspective view illustrating a configuration of a piezoelectric element. FIG. 7 is a plan view of the piezoelectric element.

As illustrated in FIG. 1, the vibrating device 1 includes a piezoelectric element 10, a wiring board 40, and a diaphragm 50. The piezoelectric element 10 includes a piezoelectric element body 11 and a plurality of external electrodes 13 and 15.

The piezoelectric element body 11 has a rectangular parallelepiped shape. The piezoelectric element body 11 has a pair of principal planes 11a and 11b opposed to each other and four side surfaces 11c. The rectangular parallelepiped shape includes a rectangular parallelepiped shape with chamfered corner portions and ridge portions, and a rectangular parallelepiped shape with rounded corner portions and ridge portions. The principal planes 11a and 11b have a rectangular shape. In the present embodiment, the principal planes 11a and 11b have a square shape.

The direction in which the pair of principal planes 11a and 11b are opposed is a first direction D1. The first direction D1 is also a direction orthogonal to the principal planes 11a and 11b. The four side surfaces 11c extend in the first direction D1 in such a way as to connect the pair of principal planes 11a and 11b. The principal planes 11a and 11b and the side surfaces 11c are indirectly adjacent via a ridge line portion. The length of the piezoelectric element body 11 in the first direction D1 (the thickness of the piezoelectric element body 11) is, for example, 100 μm.

As illustrated in FIG. 6, the piezoelectric element body 11 includes a plurality of piezoelectric layers 17a, 17b, 17c, and 17d laminated in the first direction D1. In the present embodiment, the piezoelectric element body 11 includes the four piezoelectric layers 17a, 17b, 17c, and 17d. In the piezoelectric element body 11, the direction in which the plurality of piezoelectric layers 17a, 17b, 17c, and 17d is laminated accords with the first direction D1.

Each of the piezoelectric layers 17a, 17b, 17c, and 17d contains a piezoelectric material. In the present embodiment, each of the piezoelectric layers 17a, 17b, 17c, and 17d contains a piezoelectric ceramic material. Examples of the piezoelectric ceramic material include PZT[Pb(Zr, Ti)O$_3$], PT(PbTiO$_3$), PLZT[(Pb, La)(Zr, Ti)O$_3$], and barium titanate (BaTiO$_3$). Each of the piezoelectric layers 17a, 17b, 17c, and 17d is composed of a sintered body of a ceramic green sheet containing the above-described piezoelectric ceramic material, for example. In the actual piezoelectric element body 11, the piezoelectric layers 17a, 17b, 17c, and 17d are integrated to such an extent that boundaries between each two of the piezoelectric layers 17a, 17b, 17c, and 17d cannot be recognized.

The piezoelectric layer 17a has the principal plane 11a. The piezoelectric layer 17d has the principal plane 11b. The piezoelectric layers 17b and 17c are located between the piezoelectric layer 17a and the piezoelectric layer 17d. The thickness of the piezoelectric layer 17a or 17d is smaller than the thickness of the piezoelectric layer 17b or 17c. The thickness of the piezoelectric layer 17a or 17d is, for example, 33 μm. The thickness of the piezoelectric layer 17b or 17c is, for example, 16 μm.

As illustrated in FIGS. 2, 3, 4, and 6, the piezoelectric element 10 includes a plurality of internal electrodes 19, 21, and 23 disposed in the piezoelectric element body 11. In the present embodiment, the piezoelectric element 10 includes the three internal electrodes 19, 21, and 23.

Each of the internal electrodes 19, 21, and 23 contain a conductive material. As the conductive material, Ag, Pd, or an Ag—Pd alloy is used, for example. Each of the internal electrodes 19, 21, and 23 is composed as a sintered body of a conductive paste containing the above-described conductive material. Each of the internal electrodes 19, 21, and 23 has an approximately rectangular shape (for example, approximately square shape).

The internal electrodes 19, 21, and 23 are disposed at different positions (layers) in the first direction D1. The internal electrode 19 and the internal electrode 21 are opposed to each other with a space in the first direction D1. The internal electrode 21 and the internal electrode 23 are opposed to each other with a space in the first direction D1. The internal electrode 19 is located between the piezoelectric layer 17a and the piezoelectric layer 17b. The internal electrode 21 is located between the piezoelectric layer 17b and the piezoelectric layer 17c. The internal electrode 23 is located between the piezoelectric layer 17c and the piezoelectric layer 17d. That is, the internal electrodes 19, 21, and 23 are disposed in the piezoelectric element body 11 and are opposed to one another in the first direction D1.

The internal electrodes 19, 21, and 23 are not exposed to a surface of the piezoelectric element body 11. That is, the internal electrodes 19, 21, and 23 are not exposed to the side surfaces 11c. Therefore, as illustrated in FIG. 7, each of the internal electrodes 19, 21, and 23 is separated from all of edges (four sides) of the principal plane 11a or 11b and the side surfaces 11c as viewed from the first direction D1.

The plurality of external electrodes 13 and 15 is disposed on the principal plane 11a. The external electrode 13 includes a plurality of external electrodes 13a and 13b. In the present embodiment, the external electrode 13 includes the two external electrodes 13a and 13b, The external electrode 15 includes a plurality of external electrodes 15a and 15b. In the present embodiment, the external electrode 15 includes the two external electrodes 15a and 15b. Each of the external electrodes 13a, 13b, 15a, and 15b has an approximately elliptical shape as viewed from the first direction D1.

Each of the external electrodes 13 and 15 (each of the external electrodes 13a, 13b, 15a, and 15b) contains a conductive material. As the conductive material, Ag, Pd, or an Ag—Pd alloy is used, for example. Each of the external electrodes 13 and 15 is composed as a sintered body of a conductive paste containing the above conductive material.

As illustrated in FIG. 7, each of the external electrodes 13 and 15 (each of the external electrodes 13a, 13b, 15a, and 15b) is separated from all of edges (four sides) of the principal plane 11a or 11b as viewed from the first direction D1. As illustrated in FIG. 7, each of the external electrodes 13 and 15 (each of the external electrodes 13a, 13b, 15a, and 15b) is separated from all of edges (four sides) of the internal electrode 19, 21, or 23 as viewed from the first direction D1.

The external electrode 13a and the external electrode 13b are adjacent to each other. The external electrode 15a and the external electrode 15b are adjacent to each other. The four external electrodes 13a, 13b, 15a, and 15b are disposed along only one side 11d of the principal plane 11a. The external electrode 13b and the external electrode 15a are adjacent to each other.

The external electrodes 13a and 13b are electrically connected with a connection conductor 25 through a plurality of via conductors 31, respectively. The connection conductor 25 is located in the same layer as the internal electrode 19. The connection conductor 25 is located between the piezoelectric layer 17a and the piezoelectric layer 17b. The internal electrode 19 and the connection conductor 25 are separated from each other. The connection conductor 25 is opposed to the external electrodes 13a and 13b in the first direction D1. The plurality of via conductors 31 is connected with the external electrodes 13a and 13b and the connection conductor 25.

The external electrodes 15a and 15b are electrically connected with the internal electrode 19 through a plurality of via conductors 33, respectively. The internal electrode 19 is opposed to the external electrodes 15a and 15b in the first direction D1. The plurality of via conductors 33 is connected with the external electrodes 15a and 15b and the internal electrode 19.

The connection conductor 25 is electrically connected with the internal electrode 21 through a plurality of via conductors 35. The connection conductor 25 is opposed to the internal electrode 21 in the first direction D1. The plurality of via conductors 35 is connected with the connection conductor 25 and the internal electrode 21.

The internal electrode 19 is electrically connected with a connection conductor 27 through a plurality of via conductors 37. The connection conductor 27 is located in the same layer as the internal electrode 21. The connection conductor 27 is located between the piezoelectric layer 17b and the piezoelectric layer 17c. The internal electrode 21 and the connection conductor 27 are separated from each other. The connection conductor 27 is opposed to the internal electrode 19 in the first direction D1. The plurality of via conductors 37 is connected with the internal electrode 19 and the connection conductor 27.

The connection conductor 27 is electrically connected with the internal electrode 23 through a plurality of via conductors 39. The connection conductor 27 is opposed to the internal electrode 23 in the first direction D1. The plurality of via conductors 39 is connected with the connection conductor 27 and the internal electrode 23.

The external electrodes 13a and 13b are electrically connected with the internal electrode 21 through the plurality of via conductors 31, the connection conductor 25, and the plurality of via conductors 35. The external electrodes 15a and 15b are electrically connected with the internal electrode 19 through the plurality of via conductors 33. The external electrodes 15a and 15b are electrically connected with the internal electrode 23 through the plurality of via conductors 33, the internal electrode 19, the plurality of via conductors 37, the connection conductor 27, and the plurality of via conductors 39. That is, the plurality of external electrodes 13 and 15 is electrically connected with the corresponding internal electrodes 19, 21, and 23.

Each of the connection conductors 25 and 27 and the via conductors 31, 33, 35, 37, and 39 contains a conductive material. As the conductive material, Ag, Pd, or an Ag—Pd alloy is used, for example. Each of the connection conductors 25 and 27 and the via conductors 31, 33, 35, 37, and 39 is composed as a sintered body of a conductive paste containing the above conductive material. Each of the connection conductors 25 and 27 has an approximately rectangular shape. The via conductors 31, 33, 35, 37, and 39 are formed by sintering the conductive paste filled in through-holes formed in the ceramic green sheets for forming the corresponding piezoelectric layers 17a, 17b, and 17c.

Conductors electrically connected with the internal electrodes 19 and 23 and conductors electrically connected with the internal electrode 21 are not disposed on the principal plane 11b of the piezoelectric element body 11. In the present embodiment, when the principal plane 11b is viewed from the first direction D1, the entire principal plane 11b is exposed. The principal planes 11a and 11b are natural surfaces. The natural surface is a plane constituted by a surface of crystal grains grown by firing.

Conductors electrically connected with the internal electrodes 19 and 23 and conductors electrically connected with the internal electrode 21 are also not disposed on each of the side surfaces 11c of the piezoelectric element body 11. In the present embodiment, when each of the side surfaces 11c is viewed from a direction orthogonal to the side surface 11c, the entire side surface 11c is exposed. In the present embodiment, the side surfaces 11c are also natural surfaces.

The wiring board 40 includes, as illustrated in FIG. 5, a resin film 41, a plurality of conductors 43 and 45, and a coating film 47. In the present embodiment, the wiring board 40 is provided with the pair of conductors 43 and 45. The wiring board 40 is, for example, a flexible printed circuit board (FPC). The wiring board 40 extends in a predetermined direction. The direction in which the wiring board 40 extends is a second direction D2. The second direction D2 intersects with (for example, is orthogonal to) the first direction D1. The wiring board 40 is electrically connected with the piezoelectric element 10.

The resin film 41 has a pair of principal planes 41a and 41b opposed to each other, an end surface 41c, and a pair of side surfaces 41c opposed to each other. The resin film 41 has electrical insulation properties. The resin film 41 contains, for example, a polyimide resin.

The end surface 41c extends in the first direction D1 in such a way as to connect the pair of principal planes 41a and 41b. The end surface 41c is opposed to one side surface 11c. The pair of side surfaces 41d extends in the first direction D1 in such a way as to connect the pair of principal planes 41a and 41b. The pair of side surfaces 41d extends along the second direction D2. In the present embodiment, the principal plane 41b is entirely exposes when the principal plane 41b is viewed from a direction in which the principal plane 41a and the principal plane 41b are opposed to each other.

The pair of conductors 43 and 45 is disposed on the resin film 41 (principal plane 41a). The conductors 43 and 45 extend in the second direction D2. The conductor 43 and 45 are separated from each other in a direction intersecting with the second direction D2. Each of the conductors 43 and 45 contains, for example, copper.

The conductor 43 has a pair of principal planes 43a and 43b opposed to each other, an end surface 43c, and a pair of side surfaces 43d opposed to each other. The principal plane 43b is in contact with the principal plane 41a. The end surface 43c extends along the first direction D1 in such a way as to connect the pair of principal planes 43a and 43b. The end surface 43c is opposed to one side surface 11c. The pair of side surfaces 43d extends along the first direction D1 in such a way as to connect the pair of principal planes 43a and 43b. The pair of side surfaces 43d extends along the second direction D2. In the present embodiment, the end surface 41c and the end surface 43c are located on approximately the same plane.

The conductor 45 has a pair of principal planes 45a and 45b opposed to each other, an end surface 45c, and a pair of side surfaces 45d opposed to each other. The principal plane 45b is in contact with the principal plane 41a. The end surface 45c extends along the first direction D1 in such a way as to connect the pair of principal planes 45a and 45b. The end surface 45c is opposed to one side surface 11c. The pair of side surfaces 45d extends in the first direction D1 in such a way as to connect the pair of principal planes 45a and 45b. The pair of side surfaces 45d extends along the second direction D2. The side surface 43d and the side surface 45d are opposed to each other. In the present embodiment, the end surface 41c and the end surface 45c are located on approximately the same plane.

The coating film 47 is disposed on the conductors 43 and 45 in such a way as to cover a part of the conductors 43 and 45. Both end portions 43e and 45e of the conductors 43 and 45 in the second direction D2 are exposed from the coating film 47. The coating film 47 is also disposed on the principal plane 41a in such a way as to cover regions exposed from the conductors 43 and 45 on the principal plane 41a. Both end portions of the resin film 41 in the second direction D2 are exposed from the coating film 47. The coating film 47 is in contact with the conductors 43 and 45 (the principal planes 43a and 45a and the side surfaces 43d and 45d) and is in contact with the resin film 41 (principal plane 41a). The resin film 41 and the coating film 47 are bonded to each other in a region where the resin film 41 and the coating film 47 are in contact with each other. The coating film 47 contains, for example, a polyimide resin. For example, gold flash plating is applied to the both end portions 43e and 45e of the conductors 43 and 45 exposed from the coating film 47. One end portions 43e and 45e of the conductors 43 and 45 in the second direction D2 are electrically connected with the corresponding external electrodes 13 and 15. The one end portions 43e and 45e are adjacent to the piezoelectric element 10 in the second direction D2. At least the one end portions 43e and 45e may just be exposed from the coating film 47, and the other end portions 43e and 45e may be covered with the coating film 47. In this case, for example, the other end portions 43e and 45e may be exposed from the resin film 41.

The length of the wiring board 40 (the thickness of the wiring board 40) in the direction in which the principal planes 41a and 41b are opposed (the first direction D1) is defined with a total of the length of the resin film 41 (the thickness of the resin film 41) in the direction in which the principal planes 41a and 41b are opposed, the length of the conductor 43 or 45 (the thickness of the conductor 43 or 45) in the direction in which the principal planes 41a and 41b are opposed, and the length of the coating film 47 (the thickness of the coating film 47)in the direction in which the principal planes 41a and 41b are opposed. In the present embodiment, the thickness of the wiring board 40 is, for example, 70 μm. The thickness of the resin film 41 is, for example, 20 μm. The thickness of each of the conductors 43 and 45 is, for example, 20 μm. The thickness of the resin film 41 and the thickness of each of the conductors 43 and 45 may be different from each other.

The diaphragm 50 contains a metal and has principal planes 50a and 50b opposed to each other. The diaphragm 50 contains, for example, a Ni—Fe alloy, Ni, brass, or stainless steel. The diaphragm 50 (the principal planes 50a and 50b) has a rectangular shape as viewed from a direction in which the principal plane 50a and the principal plane 50b are opposed. The length of the diaphragm 50 (the thickness of the diaphragm 50) in the direction in which the principal plane 50a and the principal plane 50b are opposed is, for example, 250 μm.

The piezoelectric element 10 and the wiring board 40 are bonded to the diaphragm 50. The principal plane 11b of the piezoelectric element body 11 and the principal plane 50a of the diaphragm 50 are opposed to each other. The principal plane 41b of the resin film 41 and the principal plane 50a of the diaphragm 50 are opposed to each other. That is, the principal plane 11b and the principal plane 50a are bonded to each other. The principal plane 41b and the principal plane 50a are bonded to each other.

In a state where the piezoelectric element 10 and the wiring board 40 are bonded to the diaphragm 50, the first direction D1, the direction in which the principal plane 41a and the principal plane 41b are opposed, the direction in which the principal plane 50a and the principal plane 50b are opposed are approximately the same. The piezoelectric element 10 is disposed in a central portion of the diaphragm 50 as viewed from the first direction D1.

The piezoelectric element 10 is bonded to the diaphragm 50 with the principal plane 11b and the four side surfaces 11c by a bonding member 55. The bonding member 55 is a member for bonding the piezoelectric element 10 and the diaphragm 50. The piezoelectric element 10 can be said to be bonded to the principal plane 50a with the principal plane 11b and the side surfaces 11c by the bonding member 55. In the present embodiment, the principal plane 11b and the four side surfaces 11c are entirely covered with the bonding member 55. That is, the principal plane 11b and the four side surfaces 11c are entirely in contact with the bonding member 55. The principal plane 11a is not covered with the bonding member 55 and is exposed from the bonding member 55. The principal plane 11b and the principal plane 50a are indirectly opposed to each other via the bonding member 55.

The wiring board 40 is bonded to the diaphragm 50 with the principal plane 41b of the resin film 41 by a bonding member 57. The bonding member 57 is a member for bonding the wiring board 40 and the diaphragm 50. The wiring board 40 can be said to be bonded to the principal plane 50a by the bonding member 57. In the present embodiment, the entire region of the principal plane 41b, the region being located on the diaphragm 50, is covered with the bonding member 57. That is, the entire region of the principal plane 41b is in contact with the bonding member 57. The pair of side surfaces 41d is not covered with the bonding member 57 and is exposed from the bonding member 57. The pair of side surfaces 41d is not covered with the bonding member 55 and is exposed from the bonding member 55. The principal plane 41b and the principal plane 50a are indirectly opposed to each other via the bonding member 57.

The end surface 41c of the resin film 41 and the end surfaces 43a and 45a of the pair of conductors 43 and 45 are not covered with the bonding member 57 and are exposed from the bonding member 57. The end surfaces 41c, 43c, and 45c are covered with the bonding member 55 and are in contact with the bonding member 55. In the present embodiment, the entire end surfaces 41c, 43c, and 45c are in contact with the bonding member 55. That is, the entire end surfaces 41c, 43c, and 45c are bonded to the diaphragm 50 by the bonding member 55.

As the bonding members 55 and 57, for example, a resin (an epoxy resin, an acrylic resin, or the like) is used. The bonding members 55 and 57 do not contain a conductive filler and has electrical insulation properties. The bonding members 55 and 57 may be made of different resins or may be made of the same resin.

A distance G2 between the principal plane 41b and the diaphragm 50 (principal plane 50a) is larger than a distance G1 between the principal plane 11b and the diaphragm 50 (principal plane 50a). The distance G1 is equal to the thickness of the bonding member 55 located between the principal plane 11b and the principal plane 50a. The distance G2 is equal to the thickness of the bonding member 57 located between the principal plane 41b and the principal plane 50a. The distance G2 is, for example, 10 to 30 μm. The distance G1 is, for example, 7 μm.

The piezoelectric element 10 and the wiring board 40 are adjacent to each other on the diaphragm 50. The wiring board 40 is adjacent to the one side 11d of the principal plane 11a along which the four external electrodes 13a, 13b, 15a, and 15b are disposed as viewed from the first direction D1. The piezoelectric element 10 and the wiring board 40 are separated from each other as viewed from the first direction D1. The distance between the piezoelectric element 10 and the wiring board 40 is, for example, from 0 mm to 1 mm, exclusive of 0 mm.

The direction in which the conductors 43 and 45 extend, that is, the second direction D2, and the one side 11d intersect with each other, as viewed from the first direction D1. In the present embodiment, the second direction D2 and the one side 11d are approximately orthogonal to each other.

Figure 2:
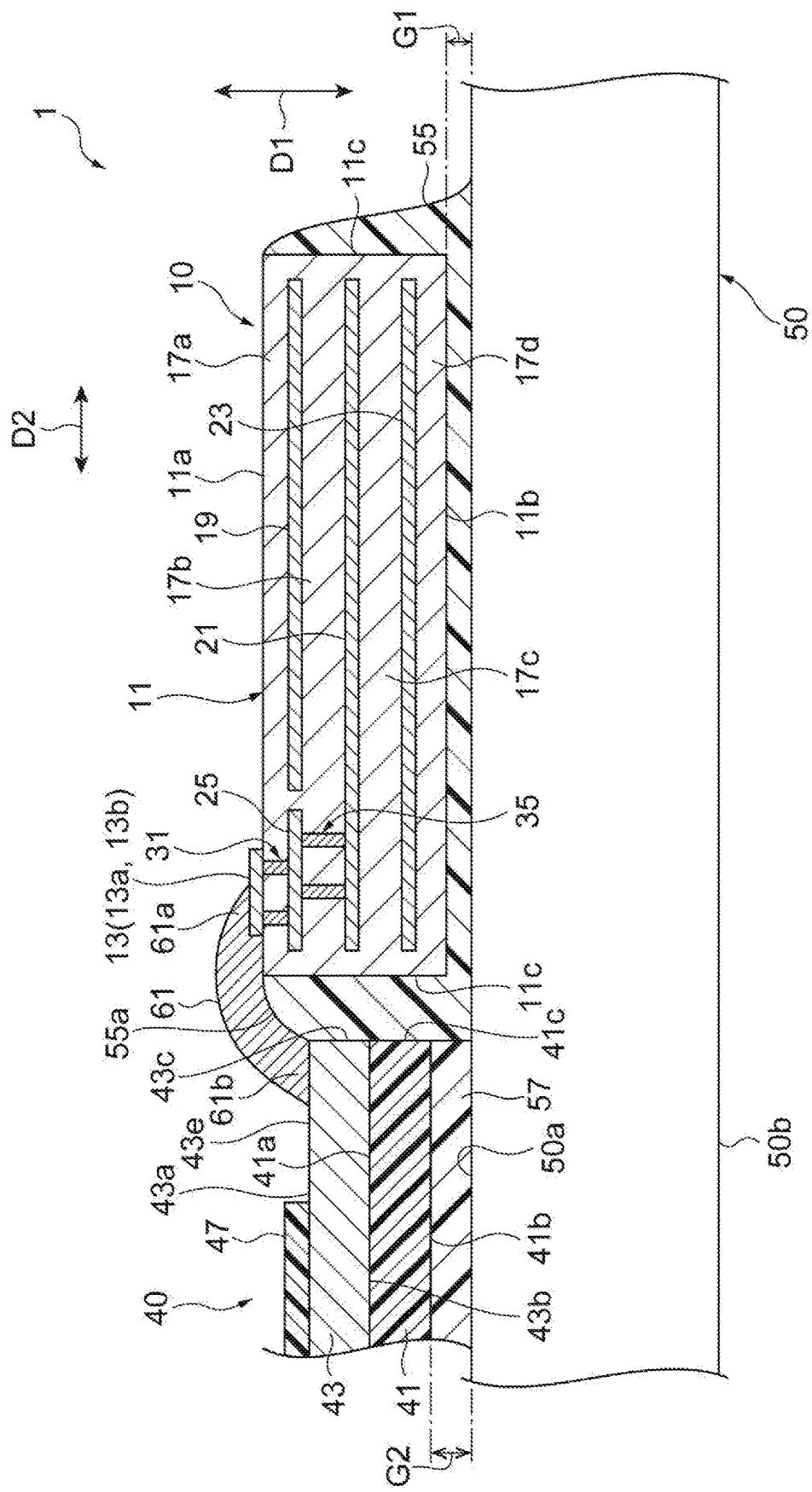
FIG. 2 is a view illustrating a sectional configuration of the vibrating device according to the present embodiment.
Figure 3:
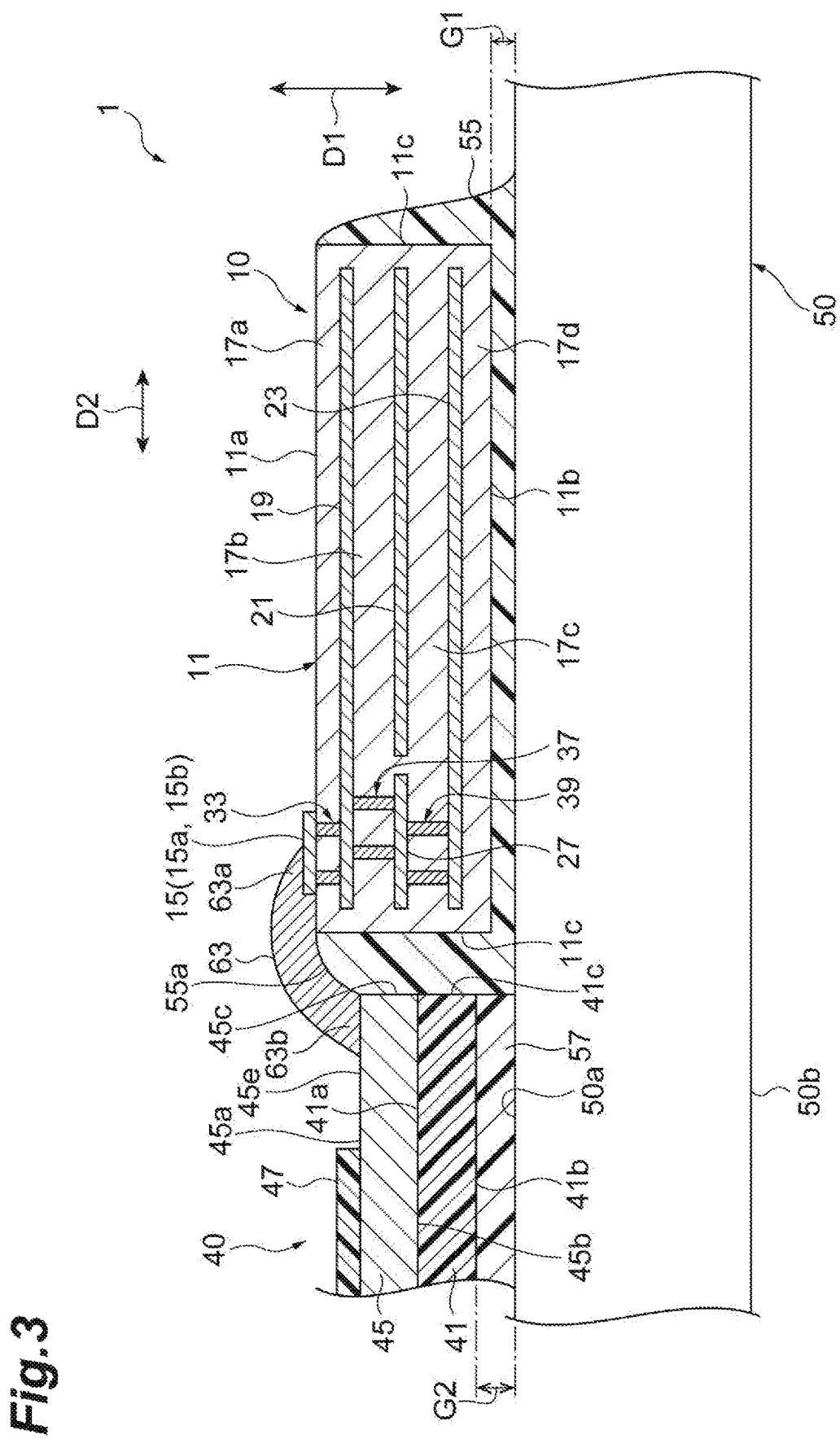
FIG. 3 is a view illustrating a sectional configuration of the vibrating device according to the present embodiment.

As illustrated in FIGS. 2 and 3, a height position (hereinafter referred to as "first height position") of the principal planes 43a and 45a of the pair of conductors 43 and 45 from the diaphragm 50 (principal plane 50a) and a height position (hereinafter referred to as "second height position") of the external electrodes 13 and 15 (external electrodes 13a, 13b, 15a, and 15b) from the diaphragm 50 (principal plane 50a) are different from each other. In the present embodiment, the first height position is lower than the second height position. In the present embodiment, the entire end surfaces 41c, 43c, and 45c are indirectly opposed to the one side surface 11c via the bonding member 55. Basically, the second height position is a height position of an upper surface of the external electrodes 13a, 13b, 15a, and 15b from the diaphragm 50 (principal plane 50a). Therefore, the distance between the principal planes 43a and 45a and the principal plane 50a can be said to be smaller than the distance between the upper surface of the external electrodes 13a, 13b, 15a, and 15b and the principal plane 50a. Note that, in a case where the thickness of each of the external electrodes 13 and 15 is sufficiently small, the second height position can be regarded to be equal to the height position of the piezoelectric element body 11 (principal plane 11a) from the diaphragm 50 (principal plane 50a).

The bonding member 55 exists between the side surface 11c, and the end surfaces 41c, 43c, and 45c opposed to each other. A surface 55a of the bonding member 55 extends in such a way as to connect the principal plane 11a and the principal plane 43a, and to connect the principal plane 11a and the principal plane 45a. The surface 55a is inclined from the principal plane 11a toward the principal planes 43a and 45a in accordance with the difference between the first height position and the second height position.

As illustrated in FIGS. 1 to 3, the vibrating device 1 includes a connecting member 61 that electrically connects the external electrodes 13a and 13b and the conductor 43, and a connecting member 63 that electrically connects the external electrodes 15a and 15b and the conductor 45.

The connecting member 61 has one end portion 61a connected with the plurality of external electrodes 13a and 13b and the other end portion 61b connected with the conductor 43 (principal plane 43a). The other end portion 61b of the connecting member 61 is connected with one end portion of the conductor 43, the one end portion being exposed from the coating film 47. The other end portion 61b of the connecting member 61 is in contact with the principal plane 43a. The conductor 43 is electrically connected with the internal electrode 21 through the connecting member 61, the external electrodes 13a and 13b (external electrode 13), the plurality of via conductors 31, the connection conductor 25, and the plurality of via conductors 35.

The connecting member 63 has one end portion 63a connected with the plurality of external electrodes 15a and 15b and the other end portion 63b connected with the conductor 45 (principal plane 45a). The other end portion 63b of the connecting member 63 is connected with one end portion of the conductor 45, the one end portion being exposed from the coating film 47. The other end portion 63b of the connecting member 63 is in contact with the principal plane 45a. The conductor 45 is electrically connected with the internal electrode 19 through the connecting member 63, the external electrodes 15a and 15b (external electrode 15), and the plurality of via conductors 33. The conductor 45 is further electrically connected with the internal electrode 23 through the plurality of via conductors 37, the connection conductor 27, and the plurality of via conductors 39.

Each of the connecting members 61 and 63 contains a conductive resin. The conductive resin layer contains a resin (for example, a thermosetting resin) and a conductive material (for example, metal powder). As the metal powder, for example, Ag powder is used. As the thermosetting resin, a phenol resin, an acrylic resin, a silicone resin, an epoxy resin, or a polyimide resin is used, for example. The hardness of the connecting members 61 and 63 is smaller than the hardness of the bonding member 55.

The connecting member 61 is disposed on the bonding member 55 in such a way as to be in contact with the external electrodes 13a and 13b and one end portion (principal plane 43a) of the conductor 43. The connecting member 63 is disposed on the bonding member 55 in such a way as to be in contact with the external electrodes 15a and 15b and one end portion of the conductor 45 (principal plane 45a). The connecting members 61 and 63 are in contact with the bonding member 55.

When voltages having different polarities are applied to the external electrode 13 (13a and 13b) and the external electrode 15 (15a and 15b) through the conductors 43 and 45, an electric field occurs between the internal electrode 21 and the internal electrodes 19 and 23. A region in the piezoelectric layer 17b, the region being sandwiched between the internal electrode 19 and the internal electrode 21, and a region in the piezoelectric layer 17c, the region being sandwiched between the internal electrode 21 and the internal electrode 23, serve as active regions, and displacement occurs in the active regions. When an AC voltage is applied to the external electrodes 13 and 15, the piezoelectric element 10 repeats expansion and contraction in accordance with the frequency of the applied AC voltage. Since the piezoelectric element 10 and the diaphragm 50 are bonded to each other, the diaphragm 50 performs flexural vibration integrally with the piezoelectric element 10 in accordance with the repetition of expansion and contraction in the piezoelectric element 10.

Figure 8:
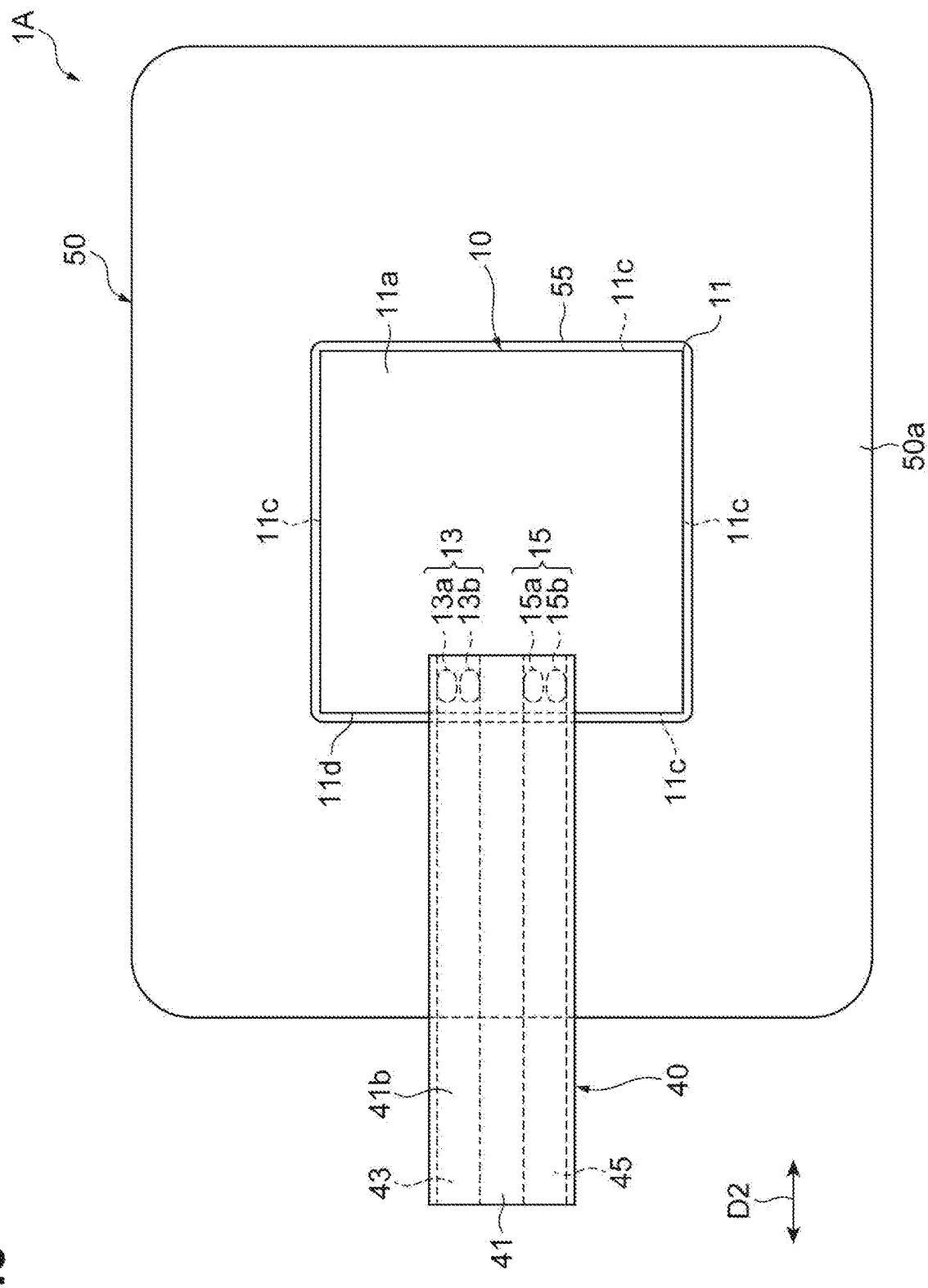
FIG. 8 is a plan view of a vibrating device according to a modification.
Figure 9:
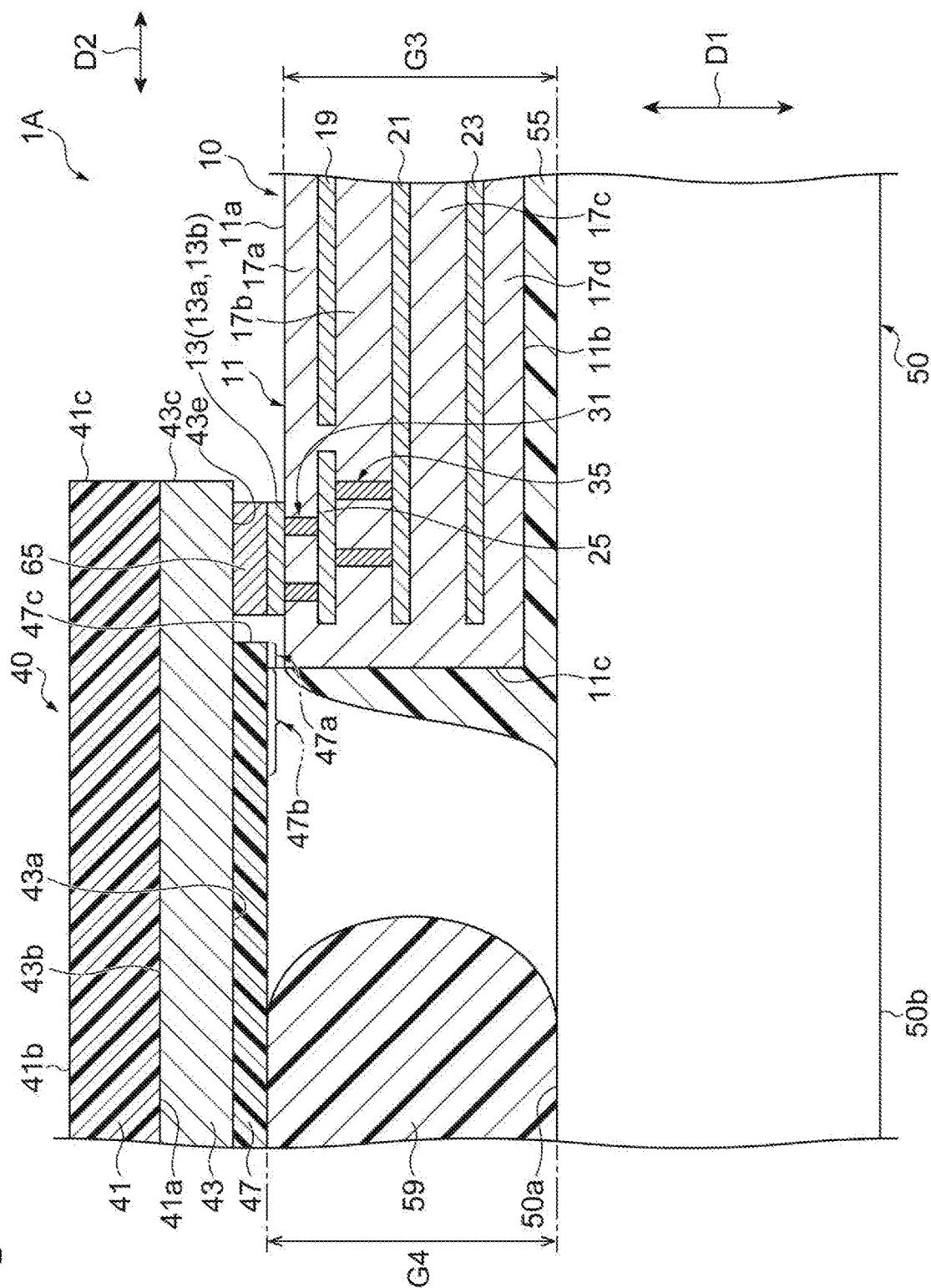
FIG. 9 is a view illustrating a sectional configuration of the vibrating device according to the modification.
Figure 10:
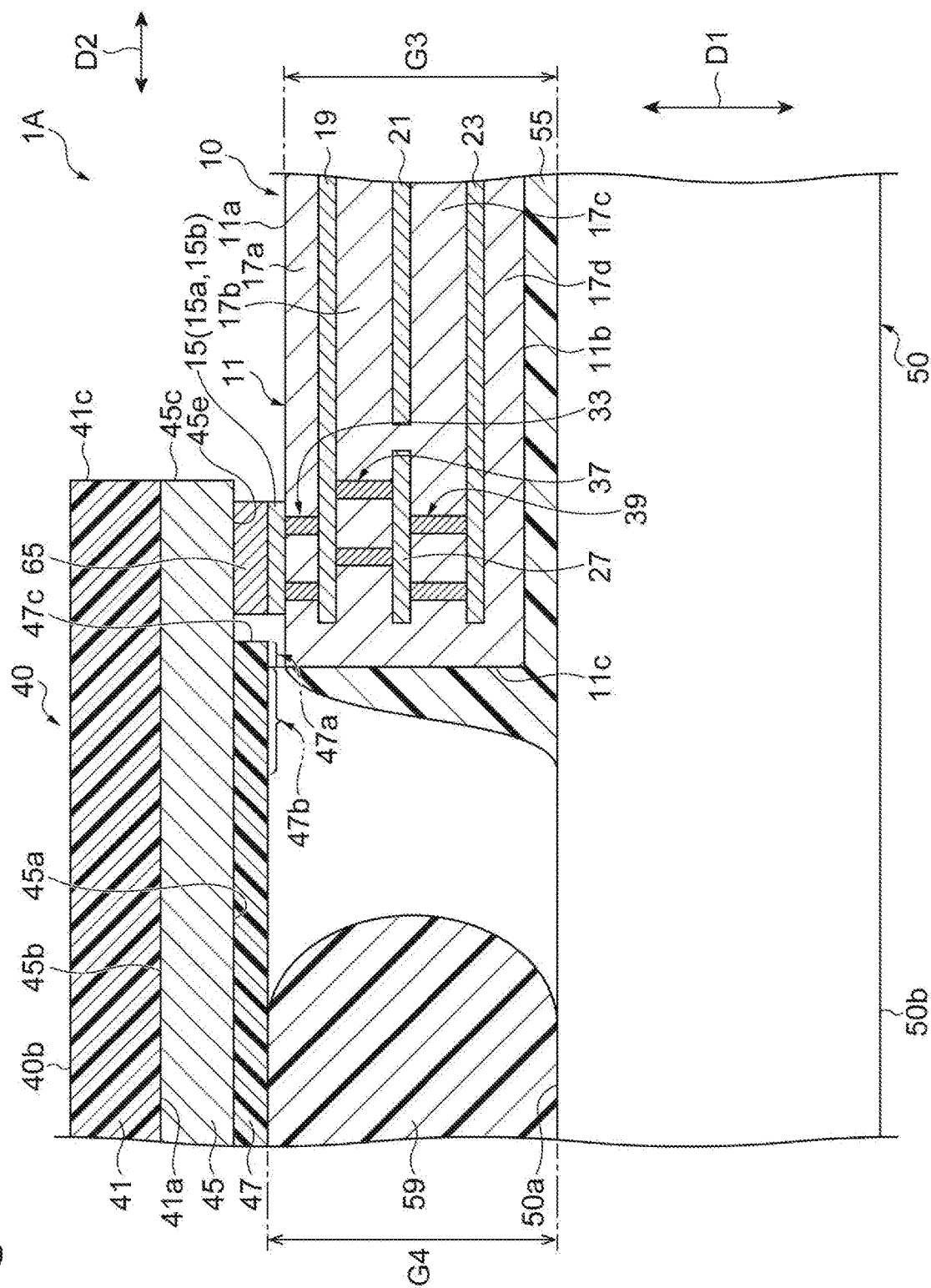
FIG. 10 is a view illustrating a sectional configuration of the vibrating device according to the modification.
Figure 11:
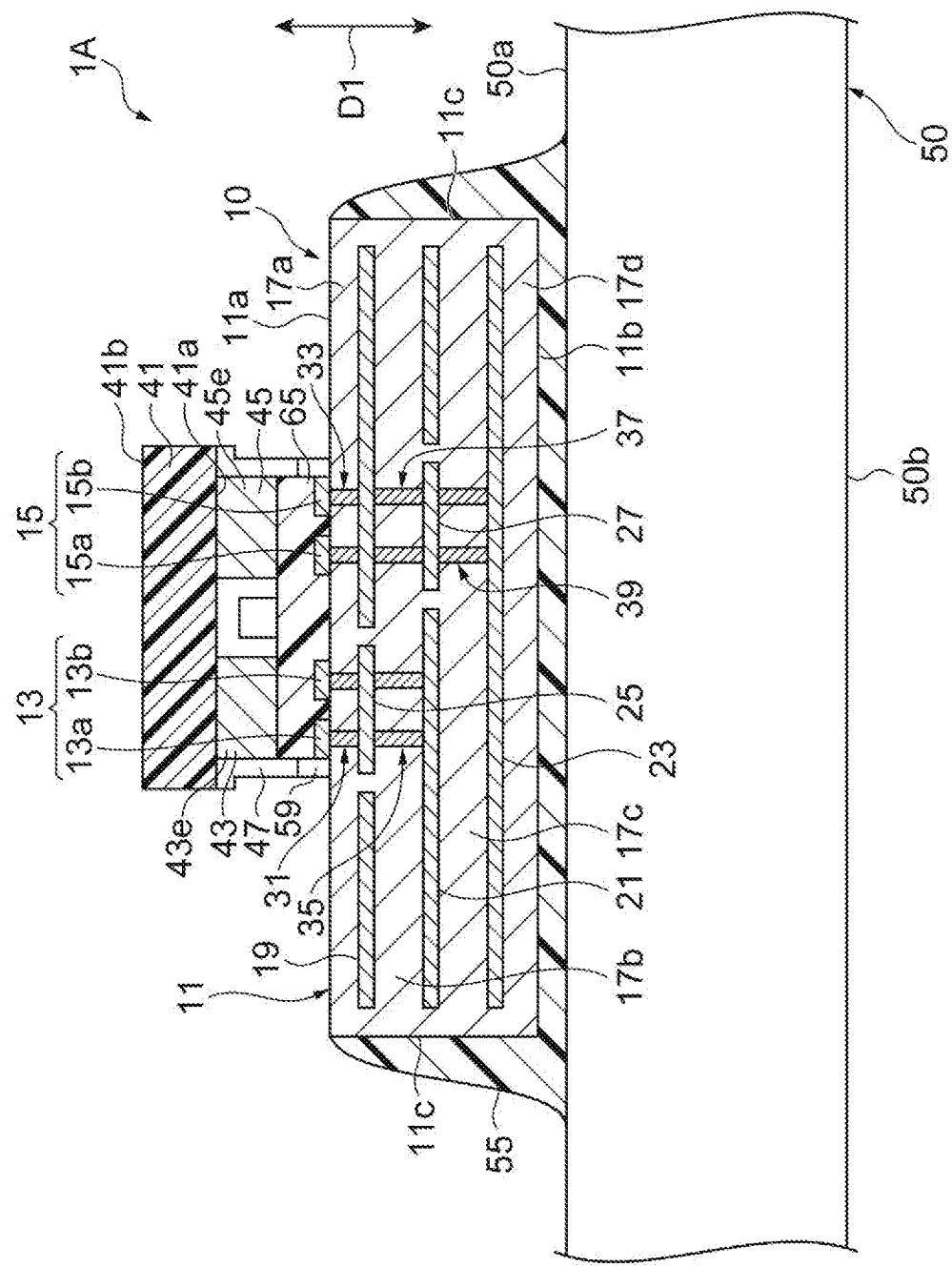
FIG. 11 is a view illustrating a sectional configuration of the vibrating device according to the modification.

A configuration of a vibrating device 1A according to a modification of the present embodiment will be described with reference to FIGS. 8 to 11. FIG. 8 is a plan view of a vibrating device according to a modification. FIGS. 9 to 11 are views illustrating a sectional configuration of the vibrating device according to the modification. The vibrating device 1A illustrated in FIGS. 8 to 11 is different from the vibrating device 1 illustrated in FIGS. 1 to 7 mainly in disposition of a wiring board 40. Hereinafter, the vibrating device 1A will be described mainly focusing on the difference from the vibrating device 1.

In the vibrating device 1A, the wiring board 40 is disposed in such a way that a coating film 47 is opposed to a principal plane 50a of a diaphragm 50. That is, the wiring board 40 is disposed in such a way that a principal plane 41a is opposed to the principal plane 50a. The coating film 47 is bonded to the principal plane 50a by a bonding member 59 instead of the bonding member 57 (see FIG. 2). The bonding member 59 is, for example, a film-like adhesive resin. The coating film 47 is bonded to the principal plane 50a by the bonding member 59. As the bonding member 59, for example, a resin (an epoxy resin, an acrylic resin, or the like) is used. The bonding member 59 does not contain a conductive filler and has electrical insulation properties. The bonding members 55 and 59 may be made of different resins or may be made of the same resin. The bonding member 55 and the bonding member 59 are separated from each other in a second direction D2. The distance between the bonding member 55 and the bonding member 59 is, for example, from 0 mm to 2 mm, exclusive of 0 mm. The bonding member 59 is provided up to an edge of the principal plane 50a.

In the vibrating device 1, the piezoelectric element 10 and the wiring board 40 are adjacent on the diaphragm 50, whereas in the vibrating device 1A, the wiring substrate 40 is disposed on a piezoelectric element 10. The vibrating device 1A has a connecting member 65 instead of the connecting members 61 and 63 (see FIGS. 2 and 3). The connecting member 65 electrically connects one end portion 43e (principal plane 43a) and external electrodes 13a and 13b. The connecting member 65 also electrically connects one end portion 45e (principal plane 45a) and external electrodes 15a and 15b. The one end portion 43e (principal plane 43a) of a conductor 43 is disposed on the external electrodes 13a and 13b, and is opposed to the external electrodes 13a and 13b via the connecting member 65 in a first direction D1. The one end portion 45e (principal plane 45a) of a conductor 45 is disposed on the external electrodes 15a and 15b, and is opposed to the external electrodes 15a and 15b via the connecting member 65 in the first direction D1.

As illustrated in FIG. 11, the connecting member 65 is continuously provided from the one end portion 43e to the one end portion 45e. The connecting member 65 is formed as an anisotropic conductive paste (APC) is cured. The connecting member 65 has conductivity in a thickness direction (first direction D1). The connecting member 65 has insulating properties in a plane direction orthogonal to the thickness direction. Therefore, the external electrode 13 and the external electrode 15 are kept in an electrically insulated state.

A distance G4 between the coating film 47 and the principal plane 50a is larger than a distance G3 between a principal plane 11a and the principal plane 50a. Therefore, the coating film 47 is separated from the principal plane 11a in the first direction D1. The distance between the coating film 47 and the principal plane 11a is, for example, from 0 mm to 1 mm, exclusive of 0 mm. The distance G3 is defined with a total of the thickness of the bonding member 55 located between the principal plane 11b and the principal plane 50a, and the thickness of the piezoelectric element 10. The distance G4 is equal to the thickness of the bonding member 59 located between the coating film 47 and the principal plane 50a. The distance G3 is, for example, from 50 μm to 2 mm, both inclusive. The distance G3 is, for example, 110 μm. The distance G4 is, for example, from 50 μm to 2 mm, both inclusive. The distance G4 is, for example, 120 μm.

The coating film 47 has a region 47a overlapping with the principal plane 11a of the piezoelectric element 10 as viewed from the first direction D1. That is, an end surface 47c of the coating film 47 is disposed inside an edge (four sides) of the principal plane 11a as viewed. Firm the first direction D1. The region 47a (coating film 47) is separated from the principal plane 11a of the piezoelectric element 10 in the first direction D1. The distance between the region 47a (coating film 47) and the principal plane 11a is equal to the difference between the distance G4 and the distance G3. The region 47a (coating film 47) is separated from internal electrodes 19, 21, and 23 as viewed from the first direction D1. The coating film 47 has a region 47b overlapping with the bonding member 55 as viewed from the first direction D1. The region 47b (coating film 47) is separated from the bonding member 55 in the first direction D1.

A portion of the coating film 47, the portion being located on the diaphragm 50, is composed of the region 47a, the region 47b, a region opposed to an exposed portion of the principal plane 50a in the first direction D1, and a region opposed to the bonding member 59 in the first direction D1.

As described above, in the vibrating device 1 or 1A, the principal plane 11b and the side surfaces 11c of the piezoelectric element 10 are bonded to the principal plane 50a of the diaphragm 50. Therefore, physical bonding strength between the piezoelectric element 10 and the diaphragm 50 is high. Therefore, displacement of the piezoelectric element 10 is more efficiently transmitted to the diaphragm 50. The wiring board 40 is electrically connected with the piezoelectric element 10 in a state of being bonded to the principal plane 50a together with the piezoelectric element 10. In the wiring board 40, the conductors 43 and 45 are covered with the resin film 41 and the coating film 47, except for the one end portions 43e and 45e connected with the external electrodes 13 and 15. Therefore, the wiring board 40 can be bonded to the principal plane 50a in a state where the conductors 43 and 45 and the diaphragm 50 are insulated. When vibration is transmitted from the piezoelectric element 10 to the diaphragm 50 and the diaphragm 50 vibrates because the wiring board 40 is bonded to the principal plane 50a, the wiring board 40 is displaced in synchronization with the piezoelectric element 10. Therefore, the mechanical load is less easily applied to the connection portion between the wiring board 40 and the piezoelectric element 10 than a case where the wiring board 40 is not bonded to the principal plane 50a of the diaphragm 50 and the wiring board 40 is not displaced in synchronization with the piezoelectric element 10. Therefore, in the vibrating device 1 or 1A, a decrease in reliability is suppressed.

In the vibrating device 1, the piezoelectric element 10 is repeatedly displaced (expands and contracts) in a direction orthogonal to the first direction D1. The one end portion 43e and the external electrode 13 are disposed side by side in the direction in which the piezoelectric element 10 is displaced, and connected to each other. The one end portion 45e and the external electrode 15 are disposed side by side in the direction in which the piezoelectric element 10 is displaced, and connected to each other. Therefore, the mechanical load due to the displacement of the piezoelectric element 10 easily acts on the connecting member 61 connecting the one end portions 43e and 45e and the external electrode 13, and the connecting member 63 connecting the one end portion 45e and the external electrode 15. On the other hand, in the vibrating device 1A, the one end portion 43e is disposed on the corresponding external electrode 13. The one end portion 43e and the external electrode 13 are not disposed side by side in the direction in which the piezoelectric element 10 is displaced. The one end portion 45e is disposed on the corresponding external electrode 15. The one end portion 45e and the external electrode 15 are not disposed side by side in the direction in which the piezoelectric element 10 is displaced. Therefore, the mechanical load due to the displacement of the piezoelectric element 10 less easily acts on the connecting member 65 connecting the one end portions 43e and 45e and the external electrodes 13 and 15. Therefore, in the vibrating device 1A, a decrease in reliability is suppressed.

In the vibrating device 1A, the coating film 47 has the region 47a. Therefore, the exposed portion of the principal plane 50a and the one end portions 43e and 45e are not opposed to each other in the first direction D1, and are separated from each other by at least the length of the region 47a in the second direction D2. With the configuration, contact of the diaphragm 50 and the conductors 43 and 45 and occurrence of short circuit between the electrodes can be suppressed. Further, in the vibrating device 1A, the coating film 47 has the region. 47b. Therefore, the exposed portion of the principal plane 50a and the one end portions 43e and 45e are separated from each other by a length defined by the total of at least the length of the region 47a and the length of the region 47b in the second direction D2. With the configuration, occurrence of short circuit between the electrodes can be suppressed.

As compared with the vibrating device 1A, in a vibrating device according to a first reference example, the coating film 47 does not have the regions 47a and 47b, and the end surface 47c of the coating film 47 is disposed outside the principal plane 11a and the bonding member 55 as viewed from the first direction D1. The exposed portion of the principal plane 50a and the one end portions 43e and 45e are disposed to be opposed to each other in the first direction D1. Therefore, at the time of driving of the vibrating device according to the first reference example, the diaphragm 50 and the conductors 43 and 45 come in contact and short circuit between the electrodes may occur. In a vibrating device according to a second reference example, the end surface 47c of the coating film 47 is disposed on the same plane as the side surfaces 11c of the piezoelectric element 10 as viewed from the first direction D1. Therefore, at the time of driving of the vibrating device according to the second reference example, the coating film 47 comes in contact with a ridge portion of the piezoelectric element 10, and cracks may occur in the ridge portion of the piezoelectric element 10.

In the vibrating device 1A, the region 47a is separated from the piezoelectric element 10 in the first direction D1. Therefore, damage to the piezoelectric element 10 due to contact of the region 47a with the piezoelectric element 10 can be suppressed.

The displacement of the piezoelectric element 10 occurs in a region of the piezoelectric element 10, where the internal electrodes 19, 21, and 23 are disposed. In the vibrating device 1A, the region 47a is separated from the internal electrodes 19, 21, and 23 as viewed from the first direction D1. Therefore, impediment of the displacement of the piezoelectric element 10 due to contact of the region 47a with the region of the piezoelectric element 10, where the internal electrodes 19, 21, and 23 are disposed, can be suppressed.

In the vibrating device 1A, the piezoelectric element 10 is bonded to the principal plane 50a by the bonding member 55. The coating film 47 is bonded to the principal plane 50a by the bonding member 59. The bonding member 55 and the bonding member 59 are separated from each other. Therefore, even if the bonding member 59 is, for example, a resin having fluidity, infiltration of the bonding member 59 between the piezoelectric element 10 and the region 47a via the bonding member 55 can be suppressed. Therefore, a decrease in flatness of the wiring board 40 due to the infiltration of the bonding member 59 between the piezoelectric element 10 and the region 47a is suppressed. As a result, a local load is less easily act on the conductors 43 and 45, and thus a decrease in reliability can be further suppressed.

In the vibrating device 1 or 1A, the diaphragm 50 contains a metal. The diaphragm 50 containing a metal has a higher Q value and strength than a diaphragm made of glass. Therefore, the displacement amount of the vibrating device 1 or 1A is improved.

The piezoelectric element 10 is disposed in the central portion of the diaphragm 50 as viewed in the first direction D1. Therefore, in the vibrating device 1 or 1A, the displacement of the piezoelectric element 10 is efficiently transmitted to the diaphragm 50.

The external electrodes 13 and 15 (13a, 13b, 15a, and 15b) are disposed not on the principal plane 11b but on the principal plane 11a. The principal plane 11b is bonded to the diaphragm 50. Conductors electrically connected with the internal electrodes 19, 21, and 23 are not disposed on the principal plane 11b. The external electrodes 13 and 15 (13a, 13b, 15a, and 15b) are separated from all the edges of the principal plane 11a as viewed from the first direction D1. As a result, even when the diaphragm 50 contains a metal, the piezoelectric element 10 (the external electrodes 13 and 15 and the internal electrodes 19, 21, and 23) and the diaphragm 50 are electrically insulated. Therefore, a short circuit between the piezoelectric element 10 and the diaphragm 50 is less easily occur, and the electrical reliability of the vibrating device 1 or 1A is improved.

The piezoelectric element body 11 has the four side surfaces 11c, and the internal electrodes 19, 21, and 23 are not exposed to the side surfaces 11c. Therefore, in the vibrating device 1 or 1A, the piezoelectric element 10 and the diaphragm 50 are further reliably electrically insulated.

The external electrodes 13a, 13b, 15a, and 15b are separated from all the edges of the internal electrodes 19, 21, and 23 as viewed from the first direction D1. Therefore, in the vibrating device 1 or 1A, the external electrodes 13a, 13b, 15a, and 15b are further separated from the edges of the principal plane 11a as viewed from the first direction D1. As a result, the external electrodes 13a, 13b, 15a, and 15b and the diaphragm 50 are further reliably electrically insulated.

The two external electrodes 13a and 13b electrically connected with the internal electrode 21 are adjacent to each other on the principal plane 11a. The two external electrodes 15a and 15b electrically connected with the internal electrodes 19 and 23 are also adjacent to each other on the principal plane 11a. The two external electrodes 13a and 13b are electrically connected with the conductor 43 through the connecting member 61 in the vibrating device 1. The two external electrodes 13a and 13b are electrically connected with the conductor 43 through the connecting member 65 in the vibrating device 1A. The two external electrodes 15a and 15b are electrically connected with the conductor 45 through the connecting member 63 in the vibrating device 1. The two external electrodes 15a and 15b are electrically connected with the conductor 45 through the connecting member 65 in the vibrating device 1A. Therefore, in the vibrating device 1 or 1A, the electrical connection reliability between the piezoelectric element 10 and the wiring board 40 is improved.

Each of the principal planes 11a and 11b has a rectangular shape as viewed from the first direction D1. The four external electrodes 13a, 13b, 15a, and 15b are disposed along only one side 11d of the edges of the principal plane 11a. Therefore, in the vibrating device 1 or 1A, the electrical connection between the four external electrodes 13a, 13b, 15a, and 15b and the wiring board 40 (conductors 43 and 45) is easily realized.

The two external electrodes 13a and 13b are electrically connected with the conductor 43 through the connecting member 61 in the vibrating device 1. The two external electrodes 13a and 13b are electrically connected with the conductor 43 through the connecting member 65 in the vibrating device 1A. Therefore, in the vibrating device 1 or 1A, the electrical connection between the two external electrodes 13a and 13b and the conductor 43 is easily realized. The two external electrodes 15a and 15b are electrically connected with the conductor 45 through the connecting member 63 in the vibrating device 1. The two external electrodes 15a and 15b are electrically connected with the conductor 45 through the connecting member 65 in the vibrating device 1A. Therefore, the electrical connection between the two external electrodes 15a and 15b and the conductor 45 is easily realized.

The member (bonding member) 55 that bonds the piezoelectric element 10 and the diaphragm 50 does not contain a conductive filler. Therefore, in the bonding member 55, the resin component contained in the same volume is larger and the adhesive strength is higher than those of a bonding member containing the conductive filler. Therefore, in the vibrating device 1 or 1A, the bonding strength between the diaphragm 50 and the piezoelectric element 10 is increased.

No member other than the bonding member 55 exists between the piezoelectric element 10 and the diaphragm 50. Therefore, the displacement of the piezoelectric element 10 is more efficiently transmitted by the diaphragm 50.

In the vibrating device 1, the piezoelectric element 10 is electrically connected with the wiring board 40 disposed on the diaphragm 50 on which the piezoelectric element 10 is disposed. Therefore, the difference between the first height position and the second height position is smaller than that of a vibrating device according to a third reference example. Therefore, in the vibrating device 1, a mechanical load acting on the connecting members 61 and 63 is low. As a result, a decrease in electrical connection reliability between the external electrodes 13 and 15 and the conductors 43 and 45 via the connecting members 61 and 63 is suppressed. In the vibrating device according to the third reference example, the external electrodes 13 and 15 and a conductor formed on the diaphragm 50 through an insulating thin film are electrically connected through a conductive resin. The difference between the first height position and the second height position is a difference in height between the external electrodes 13 and 15 (13a, 13b, 15a, and 15b) and the conductors 43 and 45 in the first direction D1.

The piezoelectric element 10 and the wiring board 40 are separated as viewed from the first direction D1. The surface 55a of the bonding member 55 connects the principal plane 11a and the principal plane 43a, and connects the principal plane 11a and the principal plane 45a. The surface 55a is inclined from the principal plane 11a toward the principal planes 43a and 45a. Therefore, in the vibrating device 1, shape change of the connecting members 61 and 63 is gentler than a vibrating device in which the piezoelectric element 10 and the wiring board 40 are in contact with each other. Therefore, the mechanical load acting on the connecting members 61 and 63 is lower.

The connecting members 61 and 63 are disposed on the member 55 that bonds the piezoelectric element 10 and the diaphragm 50. Therefore, in the vibrating device 1, the connecting members 61 and 63 are easily formed.

The hardness of the connecting members 61 and 63 is smaller than the hardness of the member 55 that bonds the piezoelectric element 10 and the diaphragm 50. Therefore, in the vibrating device 1, the connecting members 61 and 63 are more easily deformed in accordance with the displacement of the piezoelectric element 10 than a vibrating device in which the hardness of the connecting members 61 and 63 is equal to or higher than the hardness of the member 55 that bonds the piezoelectric element 10 and the diaphragm 50. As a result, a decrease in electrical connection reliability between the external electrodes 13 and 15 and the conductors 43 and 45 via the connecting members 61 and 63 is suppressed.

The embodiments of the present invention have been described. The present invention is not necessarily limited to the above-described embodiments, and various modifications can be made without departing from the gist thereof.

The number of the internal electrodes, the number of the piezoelectric layers 17a, 17b, 17c, and 17d, and the number of the external electrodes 13 and 15 (13a, 13b, 15a, and 15b) included in the piezoelectric element 10 are not limited to the numbers disclosed in the above-described embodiment.

The diaphragm 50 may be a casing of an electronic device or the like. The diaphragm 50 may be a separate member from the casing of an electronic device or the like. In this case, the diaphragm 50 may be attached to the causing by surface bonding.

In the vibrating device 1A, the bonding member 55 and the bonding member 59 may be in contact with each other, and the coating film 47 may not have the region opposed to the exposure portion of the principal plane 50a in the first direction D1. In this case, at the time of driving of the vibrating device 1A, contact of the diaphragm 50 and the conductors 43 and 45 and occurrence of short circuit between the electrodes can be suppressed. Further, in this case, occurrence of the short circuit between the electrodes can be similarly suppressed even if the coating film 47 does not have the regions 47a and 47b.

What is claimed is:

1. A vibrating device comprising:
 a diaphragm having a first principal plane;
 a piezoelectric element bonded to the first principal plane; and
 a wiring board bonded to the first principal plane and electrically connected with the piezoelectric element, wherein
 the piezoelectric element includes
 a piezoelectric element body containing a piezoelectric material, and having a second principal plane and a third principal plane opposed to each other and a side surface adjacent to the second principal plane and the third principal plane,
 a plurality of internal electrodes disposed in the piezoelectric element body, and opposed to one another in an opposing direction of the second principal plane and the third principal plane, and
 a plurality of external electrodes disposed on the second principal plane, and electrically connected with corresponding internal electrodes, of the plurality of internal electrodes,
 the third principal plane and the side surface are bonded to the first principal plane,
 the wiring board includes
 a resin film,
 a plurality of conductors disposed to extend on the resin film, and
 a coating film disposed on the plurality of conductors to cover the plurality of conductors, and
 one end portions of the plurality of conductors are exposed from the coating film, and are electrically connected with corresponding external electrodes, of the plurality of external electrodes.

2. The vibrating device according to claim 1, wherein
 the wiring board is disposed in such a way that the coating film is opposed to the first principal plane,
 the coating film is bonded to the first principal plane, and
 the one end portions are disposed on the corresponding external electrodes.

3. The vibrating device according to claim 2, wherein the coating film has an overlapping region overlapping with the piezoelectric element as viewed from the opposing direction.

4. The vibrating device according to claim 3, wherein the overlapping region is separated from the piezoelectric element in the opposing direction.

5. The vibrating device according to claim 3, wherein the overlapping region is separated from the internal electrodes in the opposing direction.

6. The vibrating device according to claim 2, wherein
 the third principal plane and the side surface are bonded to the first principal plane by a first bonding member,
 the coating film is bonded to the first principal plane by a second bonding member, and
 the first bonding member and the second bonding member are separated from each other.

7. A vibrating device comprising:
 a piezoelectric element;
 a wiring board electrically connected with the piezoelectric element; and
 a diaphragm to which the piezoelectric element and the wiring board are bonded, wherein
 the piezoelectric element includes
 a piezoelectric element body containing a piezoelectric material, and having a first principal plane and a second principal plane opposed to each other, and a side surface adjacent to the first principal plane and the second principal plane,
 a plurality of internal electrodes disposed in the piezoelectric element body, and opposed to one another in a direction in which the first principal plane and the second principal plane are opposed, and
 a plurality of external electrodes disposed on the first principal plane, and electrically connected with corresponding internal electrodes, of the plurality of internal electrodes,
 the wiring board includes
 a resin film having a third principal plane and a fourth principal plane opposed to each other, and
 a plurality of conductors disposed on the third principal plane, and electrically connected with corresponding external electrodes, of the plurality of external electrodes,
 the second principal plane, the side surface, and the fourth principal plane are bonded to the diaphragm, and
 a first distance between the fourth principal plane and the diaphragm is larger than a second distance between the second principal plane and the diaphragm.

8. The vibrating device according to claim 7, wherein the external electrodes and the corresponding conductors are connected to each other with a conductive resin, each of the conductors has a fifth principal plane in contact with the third principal plane, and a sixth principal plane opposed to the fifth principal plane and with which the conductive resin is in contact, and a height position of the sixth principal plane from the diaphragm and a height position of the external electrode from the diaphragm are different from each other.

9. The vibrating device according to claim 8, wherein the height position of the sixth principal plane from the diaphragm is lower than the height position of the external electrode from the diaphragm, the resin film further has a first end surface opposed to the side surface of the piezoelectric element body, each of the conductors has a second end surface opposed to the side surface of the piezoelectric element body, and the first end surface and the second end surface are entirely bonded to the diaphragm.

10. The vibrating device according to claim 7, wherein the second principal plane and the side surface are bonded to the diaphragm by a first bonding member, and the fourth principal plane is bonded to the diaphragm by a second bonding member.

11. The vibrating device according to claim 7, wherein conductors electrically connected with the plurality of internal electrodes are not disposed on the second principal plane.

12. The vibrating device according to claim 7, wherein the plurality of internal electrodes is not exposed on the side surface.

13. The vibrating device according to claim 7, wherein the plurality of external electrodes is separated from all of edges of the plurality of internal electrodes as viewed from the direction.

* * * * *